(12) United States Patent
Kim et al.

(10) Patent No.: US 11,584,983 B2
(45) Date of Patent: Feb. 21, 2023

(54) METHOD OF MANUFACTURING MASK, MASK MANUFACTURED BY THE SAME, AND METHOD OF MANUFACTURING DISPLAY APPARATUS BY USING THE SAME

(71) Applicant: Samsung Display Co., Ltd., Yongin-si (KR)

(72) Inventors: Taesung Kim, Yongin-si (KR); Yunjong Yeo, Yongin-si (KR); Hyunmin Cho, Yongin-si (KR); Jihee Son, Yongin-si (KR); Sungsoon Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/025,850

(22) Filed: Sep. 18, 2020

(65) Prior Publication Data
US 2021/0277512 A1    Sep. 9, 2021

(30) Foreign Application Priority Data

Mar. 6, 2020 (KR) .................. 10-2020-0028585

(51) Int. Cl.
*C23C 14/04* (2006.01)
*H01L 51/00* (2006.01)
*H01L 27/32* (2006.01)

(52) U.S. Cl.
CPC ........ *C23C 14/042* (2013.01); *H01L 51/0011* (2013.01); *H01L 27/3244* (2013.01)

(58) Field of Classification Search
CPC .......................... C23C 14/042; C23C 16/042
See application file for complete search history.

(56) References Cited

U.S. PATENT DOCUMENTS

| | | | |
|---|---|---|---|
| 9,972,810 B2 | 5/2018 | Moon et al. | |
| 9,982,333 B2 | 5/2018 | Nam et al. | |
| 2004/0142108 A1 | 7/2004 | Atobe et al. | |
| 2014/0231970 A1* | 8/2014 | Schneider | H01L 21/266 257/657 |
| 2015/0037928 A1* | 2/2015 | Hirobe | B05B 12/20 438/99 |
| 2018/0083192 A1* | 3/2018 | Jeong | H01L 51/0014 |
| 2019/0044070 A1* | 2/2019 | Nishida | B32B 7/025 |
| 2019/0106781 A1* | 4/2019 | Sakio | C23C 14/042 |

FOREIGN PATENT DOCUMENTS

| | | |
|---|---|---|
| KR | 10-0641478 B1 | 10/2006 |
| KR | 10-2016-0000069 A | 1/2016 |
| KR | 10-2016-0061568 A | 6/2016 |
| KR | 10-2017-0066766 A | 6/2017 |
| KR | 10-2019-0014188 A | 2/2019 |

* cited by examiner

*Primary Examiner* — Alex A Rolland
(74) *Attorney, Agent, or Firm* — Lewis Roca Rothgerber Christie LLP

(57) ABSTRACT

A method of manufacturing a mask, includes forming an organic material layer on a mask substrate and patterning a hard mask on the organic material layer, etching the organic material layer to form a mask sheet including through holes, removing the hard mask on the mask sheet, forming a conductive material layer on the mask sheet, and etching the conductive material layer to form a conductive layer.

9 Claims, 14 Drawing Sheets

METHOD OF MANUFACTURING MASK, MASK MANUFACTURED BY THE SAME, AND METHOD OF MANUFACTURING DISPLAY APPARATUS BY USING THE SAME

CROSS-REFERENCE TO RELATED APPLICATION

This application claims priority to and the benefit of Korean Patent Application No. 10-2020-0028585, filed on Mar. 6, 2020, in the Korean Intellectual Property Office, the entire content of which is hereby incorporated by reference.

BACKGROUND

1. Field

One or more embodiments of the present disclosure relate to a method of manufacturing a mask, a mask manufactured by the same, and a method of manufacturing a display apparatus by using the same, and, for example, to a method of manufacturing a mask, whereby deposition uniformity may be enhanced, a mask manufactured by the same, and a method of manufacturing a display apparatus by using the same.

2. Description of Related Art

In general, when display apparatuses including organic light-emitting display apparatuses are manufactured, a variety of layers are formed through a method such as deposition. For example, in these organic light-emitting display apparatuses, a hole injection layer, a hole transport layer, an emission layer, an electron transport layer, and/or an electron injection layer is formed on a substrate by using a deposition device in a manufacturing process. In this procedure, a material may be deposited on a preset portion of the substrate by using a mask. In some cases, even when a metal layer is formed, the metal layer may be deposited on the preset portion of the substrate by using the mask.

SUMMARY

According to existing methods of manufacturing a mask, a mask manufactured by the same, and a method of manufacturing a display apparatus by using the same, when using a large area mask that can be used for large display apparatuses, deposition uniformity is lowered.

One or more embodiments of the present disclosure include a method of manufacturing a mask, whereby deposition uniformity may be enhanced (e.g., improved) when manufacturing a large display apparatus, a mask manufactured by the same, and a method of manufacturing a display apparatus by using the same. However, these objectives are just examples, and the scope of the present disclosure is not limited thereby.

Additional aspects of embodiments will be set forth in part in the description which follows and, in part, will be apparent from the description, or may be learned by practice of the presented embodiments of the present disclosure.

According to one or more embodiments, a method of manufacturing a mask, includes forming an organic material layer on a mask substrate and patterning a hard mask on the organic material layer, etching the organic material layer to form a mask sheet including through holes, removing the hard mask on the mask sheet, forming a conductive material layer on the mask sheet, and etching the conductive material layer to form a conductive layer.

In the etching the organic material layer to form the mask sheet including through holes, the etching may include a dry etching process.

In the forming of the conductive material layer on the mask sheet, the conductive material layer may include at least one selected from aluminum (Al), titanium (Ti), molybdenum (Mo), copper (Cu), indium tin oxide (ITO), indium zinc oxide (IZO), and indium-gallium-zinc oxide (IGZO).

In the etching the conductive material layer to form the conductive material layer, the etching may include a dry etching process.

The conductive layer may have a first thickness from a top surface of the mask sheet, and the first thickness may be in a range of 1500 to 2500 Å.

The conductive layer may be spaced apart from the through holes and may have a mesh shape.

At least part of the conductive layer may be spaced apart from the through holes and may have an isolated pattern.

The method may further include, after the etching the conductive material layer to form the conductive layer, fixing a frame to the conductive layer and detaching the mask substrate.

The conductive layer may be fixed to the frame by electrostatic force.

The frame may be spaced apart from the through holes and may have a mesh shape.

At least part of the frame may be spaced apart from the through holes and may have an isolated pattern.

According to one or more embodiments, a mask includes a frame, a mask sheet including through holes, and a conductive layer being spaced apart from the through holes on a plane, arranged between the frame and the mask sheet and fixed to the frame.

The conductive layer may include at least one selected from Al, Ti, Mo, Cu, ITO, IZO, and IGZO.

The conductive layer may have a first thickness from a top surface of the mask sheet, and the first thickness may be in a range of 1500 to 2500 Å.

The conductive layer may be spaced apart from the through holes and may have a mesh shape.

At least part of the conductive layer may be apart from the through holes and may have an isolated pattern.

The conductive layer may be fixed to the frame by electrostatic force.

The frame may be spaced apart from the through holes and may have a mesh shape.

At least part of the frame may be spaced apart from the through holes and may have an isolated pattern.

According to one or more embodiments, a method of manufacturing a display apparatus, includes forming a pixel electrode, forming a light-emitting layer or an intermediate layer on the pixel electrode by using the mask as described above, and forming an opposite electrode on the light-emitting layer or the intermediate layer.

Other aspects and features of embodiments of the present disclosure other than the above-described aspects and features will be apparent from a detailed description of the disclosure for implementing the following disclosure, the claims, and the drawings.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
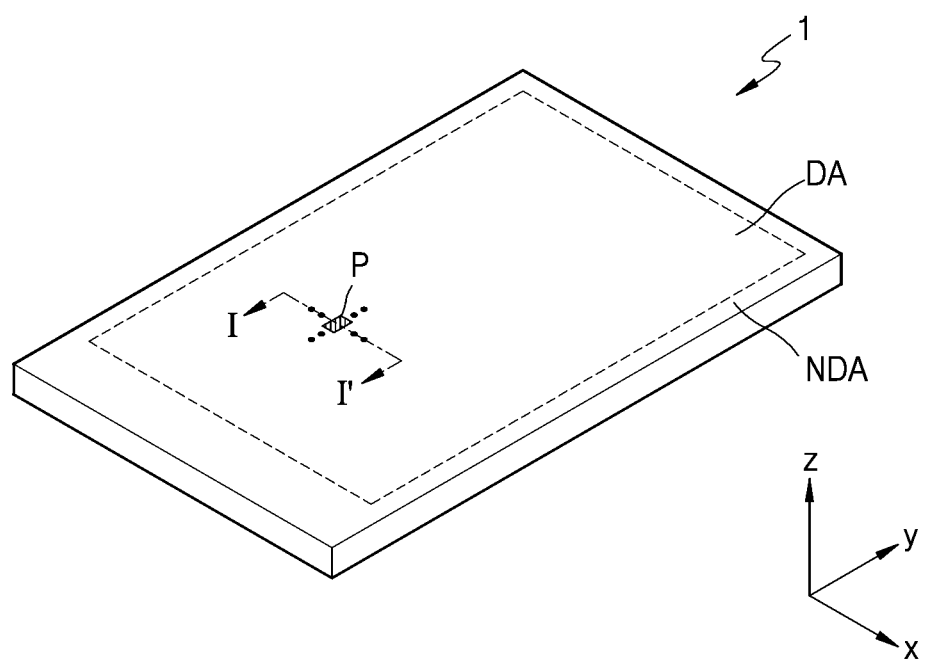
FIG. 1 is a perspective view schematically illustrating a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it may be directly or indirectly formed on the other layer, region, or component. For example, intervening layers, regions, or components may be present.

Sizes of elements in the drawings may be exaggerated or reduced for convenience of explanation. In other words, because sizes and thicknesses of components in the drawings may be arbitrarily illustrated for convenience of explanation, the following embodiments are not limited thereto.

In the present specification, "A and/or B" represents A or B individually, or both A and B. In addition, in the present specification, "At least one of A and B" represents A or B individually, or both A and B.

In the following embodiments, it will be understood that when a line "extends in a first direction or second direction," it may extend in a linear shape, or in a zigzag or curved shape along the first direction or second direction.

In the following embodiments, it will be understood that when referred to as "on a plane," this means when a target part is viewed from above, and when referred to as "on a cross-section," it means when the cross-section of the target part cut vertically is viewed from the side. In the following embodiments, it will be understood that when referred to as "overlapping," this means "planar" and/or "cross-sectional" overlapping.

Hereinafter, embodiments of the present disclosure will be described below in more detail with reference to the accompanying drawings. Those components that are the same or are in correspondence with each other are identified utilizing the same reference numeral regardless of the figure number.

FIG. 1 is a perspective view schematically illustrating a display apparatus according to an embodiment.

Referring to FIG. 1, a display apparatus 1 may include a display area DA, and a non-display area NDA around the display area DA. The non-display area NDA may surround the display area DA. The display apparatus 1 may provide (e.g., display) an image by using light emitted from a plurality of pixels P arranged in the display area DA, and the non-display area NDA may be an area in which no image is displayed (e.g., an area that is not designed to display an image).

Hereinafter, an organic light-emitting display apparatus will be described as an example of the display apparatus 1 according to an embodiment. However, the display apparatus 1 of the present disclosure is not limited thereto. In an embodiment, the display apparatus 1 according to an embodiment may be a display apparatus such as an inorganic electroluminescence (EL) display apparatus and/or a quantum dot light-emitting display apparatus. For example, a light-emitting layer of a display element included in the display apparatus 1 may include an organic material, an inorganic material, a quantum dot, an organic material and a quantum dot, and/or an inorganic material and a quantum dot.

FIG. 1 illustrates the display apparatus 1 including a flat display surface. However, embodiments are not limited thereto. In an example, the display apparatus 1 may include a stereoscopic display surface or curved display surface.

When the display apparatus 1 includes a stereoscopic display surface, the display apparatus 1 may include a plurality of display areas indicating different directions, for example, a polygonal columnar display surface. In an example, when the display apparatus 1 includes a curved display surface, the display apparatus 1 may be implemented in various suitable shapes and forms, such as, for example, a flexible display apparatus, a foldable display apparatus, and/or a rollable display apparatus.

FIG. 1 illustrates the display apparatus 1 that may be applied to a mobile phone terminal. The components of the display apparatus 1 are not limited to those shown in the drawings. For example, electronic modules mounted on a main board, a camera module, and a power supply module may be on a bracket/case together with the display apparatus 1, thereby constituting the mobile phone terminal. In some embodiments, the display apparatus 1 according to an embodiment may be applied to a large electronic device, such as, for example, a television or a monitor, and a small- and medium-sized electronic device, such as, for example, a tablet, a car navigation device, a game console, or a smart-watch.

FIG. 1 illustrates the case where the display area DA of the display apparatus 1 has a rectangular shape. However, the shape of the display area DA may be a circular shape, an oval shape, or a polygonal shape, such as a triangular or pentagonal shape.

The display apparatus 1 may include a plurality of pixels P arranged in the display area DA. Each of the plurality of pixels P may include an organic light-emitting diode OLED. Each of the plurality of pixels P may emit red, green, blue, or white light through the organic light-emitting diode OLED. It will be understood that the term "pixel," as used in the present specification, means a pixel that emits light of a color such as, for example, red, green, blue, and white, as described above.

Figure 2:
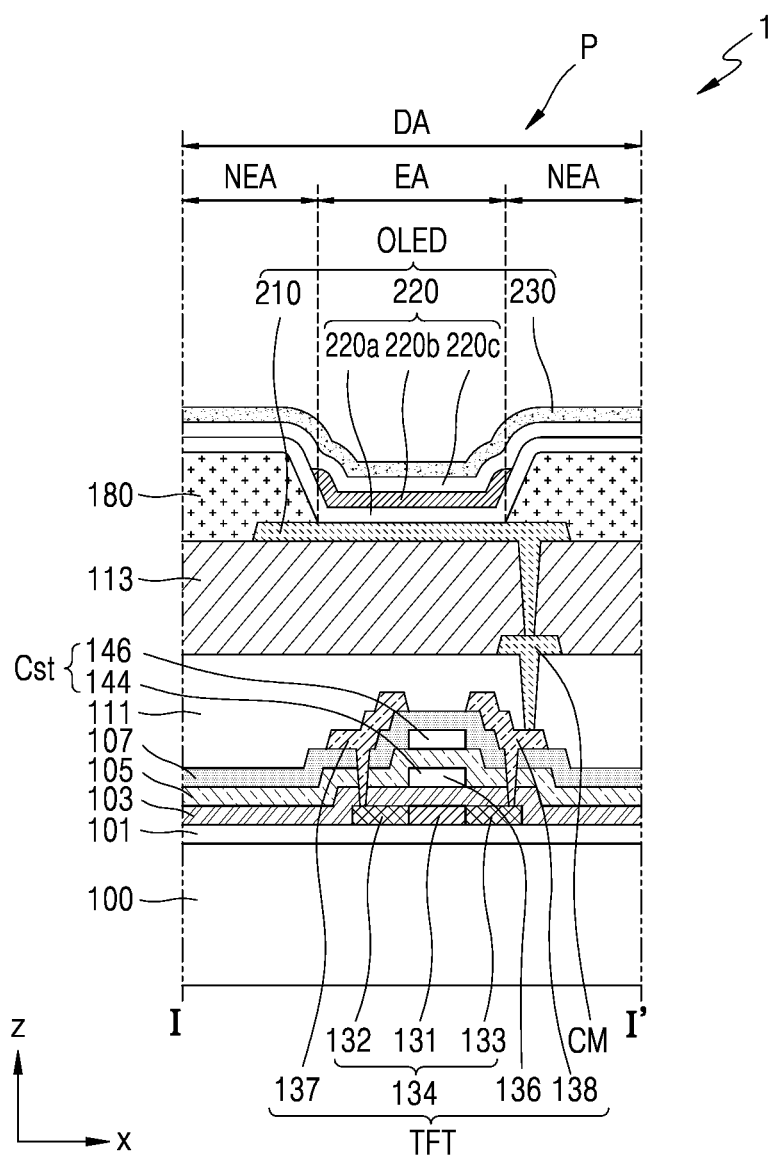
FIG. 2 is a cross-sectional view schematically illustrating a display apparatus according to an embodiment.

FIG. 2 is a cross-sectional view schematically illustrating a display apparatus according to an embodiment. More specifically, FIG. 2 is a cross-sectional view of the display apparatus taken along a line I-I' of FIG. 1.

Referring to FIG. 2, a display element may be on a substrate 100. The display element may include a thin-film transistor TFT and an organic light-emitting diode OLED.

The substrate 100 may include glass and/or polymer resin. The polymer resin may include polyethersulfone, polyacrylate, polyether imide, polyethylene naphthalate, polyethylene terephthalate, polyphenylene sulfide, polyarylate, polyimide, polycarbonate, and/or cellulose acetate propionate. The substrate 100 including polymer resin may be flexible, rollable, and/or bendable. The substrate 100 may have a multi-layer structure including a layer including the above-described polymer resin and an inorganic layer.

A buffer layer 101 may be on the substrate 100. The buffer layer 101 may be on the substrate 100, may reduce or block penetration of foreign substances, moisture, and/or external air from a lower portion of the substrate 100, and may provide a flat surface on the substrate 100. The buffer layer 101 may include an inorganic material such as oxide and/or nitride, an organic material, and/or an organic/inorganic composite material, and may have a single layer or multi-layer structure of an inorganic material and an organic material.

The thin-film transistor TFT may be on the buffer layer 101. The thin-film transistor TFT may include a semiconductor layer 134, a gate electrode 136 that overlaps the semiconductor layer 134, and a connection electrode electrically coupled to the semiconductor layer 134. The thin-film transistor TFT may be coupled to the organic light-emitting diode OLED and may drive the organic light-emitting diode OLED.

The semiconductor layer 134 may be on the buffer layer 101 and may include a channel region 131 that overlaps the gate electrode 136, a source region 132 and a drain region 133, which are on both sides of the channel region 131 and contain impurities at a higher concentration than the channel region 131. Here, the impurities may include N-type impurities or P-type impurities. The source region 132 and the drain region 133 may be electrically coupled to the connection electrode.

The semiconductor layer 134 may include an oxide semiconductor and/or a semiconductor. When the semiconductor layer 134 includes an oxide semiconductor, the semiconductor layer 134 may include at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may be InSnZnO (ITZO) or InGaZnO (IGZO). When the semiconductor layer 134 includes a silicon semiconductor, the semiconductor 134 may include amorphous silicon (a-Si) or low temperature poly-silicon (LTPS) formed by crystallizing a-Si.

A first insulating layer 103 may be on the semiconductor layer 134. The first insulating layer 103 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may have a single layer or multi-layer structure including the at least one inorganic insulating material described above.

A gate electrode 136 may be on the first insulating layer 103. The gate electrode 136 may have a single layer or multi-layer structure including at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 136 may be coupled to a gate line to apply an electrical signal to the gate electrode 136.

A second insulating layer 105 may be on the gate electrode 136. The second insulating layer 105 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 105 may have a single layer or multi-layer structure including the at least one inorganic insulating material described above.

A storage capacitor Cst may be on the first insulating layer 103. The storage capacitor Cst may include a lower electrode 144, and an upper electrode 146 that overlaps the lower electrode 144. The lower electrode 144 and the upper electrode 146 of the storage capacitor Cst may overlap each other and the second insulating layer 105 may be therebetween.

The lower electrode 144 of the storage capacitor Cst may overlap the gate electrode 136 of the thin-film transistor TFT. The lower electrode 144 of the storage capacitor Cst may be integrally arranged with the gate electrode 136 of the thin-film transistor TFT. In an embodiment, the storage capacitor Cst may not overlap the thin-film transistor TFT. The lower electrode 144 of the storage capacitor Cst may be a separate independent component from the gate electrode 136 of the thin-film transistor TFT.

The upper electrode 146 of the storage capacitor Cst may include Al, Pt, Pd, Ag, Mg, Au, Ni, Nd, Ir, Cr, Li, Ca, Mo, Ti, W, and/or Cu, and may have a single layer or multi-layer structure including the materials described above.

A third insulating layer 107 may be on the upper electrode 146 of the storage capacitor Cst. The third insulating layer 107 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The third insulating layer 107 may have a single layer or multi-layer structure including the at least one inorganic insulating material described above.

A source electrode 137 that is a connection electrode, and a drain electrode 138 may be on the third insulating layer 107. The source electrode 137 and the drain electrode 138 may include conductive materials including Mo, Al, Cu, and/or Ti, and may have a single layer or multi-layer structure including the conductive materials described above. The source electrode 137 and the drain electrode 138 may have a multi-layer structure of Ti/Al/Ti.

A first planarization layer 111 may be on the source electrode 137 and the drain electrode 138. The first planarization layer 111 may have a single layer or multi-layer structure including layers formed of organic and/or inorganic materials. In an embodiment, the first planarization layer 111 may include a general-purpose polymer such as, for example, benzocyclobutene (BCB), polyimide (PI), hexamethyldisiloxane (HMDSO), polymethylmethacrylate (PMMA) and/or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, and/or a blend thereof. The first planarization layer 111 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). After the first planarization layer 111 is formed, chemical mechanical polishing may be performed so as to provide a flat top surface.

A contact metal layer CM may be on the first planarization layer 111. The contact metal layer CM may include Al, Cu, and/or Ti, and may have a multi-layer or single layer structure. For example, the contact metal layer CM may have a multi-layer structure of Ti/Al/Ti.

A second planarization layer 113 may be on the contact metal layer CM. The second planarization layer 113 may have a single layer or multi-layer structure including layers formed of organic and/or inorganic materials. In an embodiment, the second planarization layer 113 may include a general-purpose polymer such as, for example, BCB, PI, HMDSO, PMMA or PS, a polymer derivative having a phenol-based group, acryl-based polymer, imide-based polymer, aryl ether-based polymer, amide-based polymer, fluorine-based polymer, p-xylene-based polymer, vinyl alcohol-based polymer, and/or a blend thereof. The second planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). After the second planarization layer 113 is formed, chemical mechanical polishing may be performed so as to provide a flat top surface. In an embodiment, the second planarization layer 113 may be omitted.

An organic light-emitting diode OLED including a pixel electrode 210, an intermediate layer 220, and an opposite electrode 230 may be on the second planarization layer 113. The pixel electrode 210 may be electrically coupled to the contact metal layer CM through a contact hole passing through the second planarization layer 113, and the contact metal layer CM may be electrically coupled to the source electrode 137 that is a connection electrode and the drain electrode 138 of the thin-film transistor TFT through a contact hole passing through the first planarization layer 111, so that the organic light-emitting diode OLED may be electrically coupled to the thin-film transistor TFT.

The pixel electrode 210 may be on the second planarization layer 113. The pixel electrode 210 may be a (semi-)transparent electrode or reflective electrode. The pixel electrode 210 may include a reflective layer formed of Al, Pt, Pd, Ag, Mg, Au, Ni, Nd, Ir, Cr, Li, Ca, Mo, Ti, W, Cu, and/or a compound thereof, and a transparent or semi-transparent electrode layer formed on the reflective layer. The transparent or semi-transparent electrode layer may include at least one selected from the group consisting indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 210 may have a stack structure of ITO/Ag/ITO.

A pixel-defining layer 180 may be on the second planarization layer 113. The pixel-defining layer 180 may have an opening that exposes at least part of the pixel electrode 210. An area exposed by the opening of the pixel-defining layer 180 may be defined as an emission area EA. The periphery of emission areas EA may be a non-emission area NEA, and the non-emission area NEA may surround the emission areas EA. For example, the display area DA may include a plurality of emission areas EA, and a non-emission area NEA that surrounds the plurality of emission areas EA. The pixel-defining layer 180 may increase a distance between edges of the pixel electrode 210 and the opposite electrode 230 on an upper portion of the pixel electrode 210, thereby preventing or reducing an occurrence of an arc, etc. in the edges of the pixel electrode 210. The pixel-defining layer 180 may be formed of organic insulating materials, such as, for example, PI, polyamide, acryl resin, BCB, HMDSO, and/or phenol resin, through a method such as, for example, spin coating.

An intermediate layer 220 may be on the pixel electrode 210, of which at least part is exposed by the pixel-defining layer 180. The intermediate layer 220 may include a light-emitting layer 220b, and a first functional layer 220a and a second functional layer 220c may be optionally arranged under and on the light-emitting layer 220b, respectively.

In an embodiment, the intermediate layer 220 may be formed on the pixel electrode 210, of which at least part is exposed by the pixel-defining layer 180 by using a mask (see 400 of FIG. 3) that will be further described herein below. For example, the light-emitting layer 220b of the intermediate layer 220 may be formed on the pixel electrode 210, of which at least part is exposed by the pixel-defining layer 180 by using a mask (see 400 of FIG. 3) that will be further described herein below.

The first functional layer 220a may include a hole injection layer (HIL) and/or a hole transport layer (HTL), and the second functional layer 220c may include an electron transport layer (ETL) and/or an electron injection layer (EIL).

The light-emitting layer 220b may include organic materials including fluorescent and/or phosphorescent materials that emit red, green, blue, or white light. The light-emitting layer 220b may include small molecular weight organic materials and/or polymeric organic materials.

When the light-emitting layer 220b includes small molecular weight organic materials, the intermediate layer 220 may have a structure in which an HIL, an HTL, an emission layer (EML), an ETL and an EIL are stacked in a single or composite structure, and may include various suitable small molecular weight organic materials such as, for example, copper phthalocyanine (CuPc), N,N'-Di(naphthalene-1-yl)-N,N'-diphenyl-benzidine (NPB), and tris-8-hydroxyquinoline aluminum)(Alq3). These layers may be formed through a method of vacuum deposition.

When the light-emitting layer 220b includes polymeric organic materials, the intermediate layer 220 may generally have a structure including an HTL and the light-emitting layer 220b. In this case, the HTL may include poly(3,4-ethylenedioxythiophene) (PEDOT), and the light-emitting layer 220b may include polyphenylene vinylene (PPV)-based and/or polyfluorene-based polymer materials. The light-emitting layer 220b may be formed through screen printing, ink-jet printing, and/or laser induced thermal imaging (LITI).

An opposite electrode 230 may be on the intermediate layer 220. The opposite electrode 230 may be on the intermediate layer 220 but may cover the entirety of the intermediate layer 220. The opposite electrode 230 may be arranged in the display area DA but may cover the entirety of the display area DA. For example, the opposite electrode 230 may be integrally formed with the entirety of a display panel so as to cover a plurality of pixels P arranged in the display area DA by using an open mask.

The opposite electrode 230 may include conductive materials having a small work function. For example, the opposite electrode 230 may include a (semi-) transparent layer including Ag, Mg, Al, Pt, Pd, Au, Ni, Nd, Ir, Cr, Li, Ca, and/or an alloy thereof. In some embodiments, the opposite electrode 230 may further include a layer such as ITO, IZO, ZnO, and/or $In_2O_3$ on the (semi-)transparent layer including the materials described above.

Figure 3:
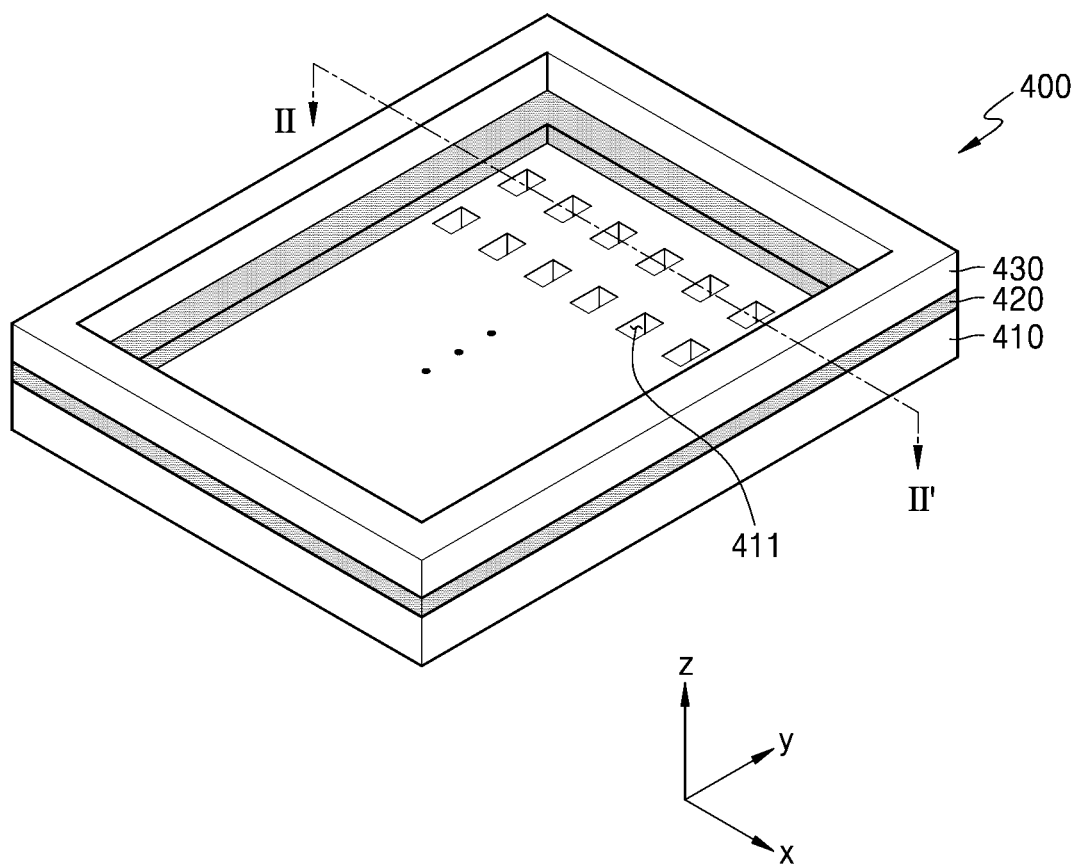
FIG. 3 is a perspective view schematically illustrating a mask according to an embodiment.
Figure 4:
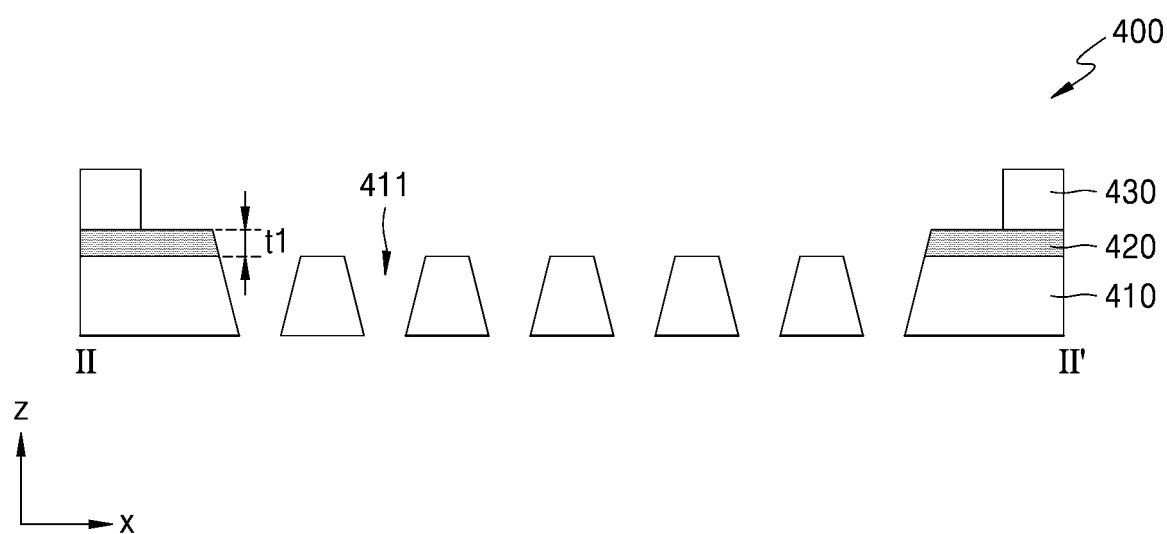
FIG. 4 is a cross-sectional view schematically illustrating a mask according to an embodiment.

FIG. 3 is a perspective view schematically illustrating a mask according to an embodiment, and FIG. 4 is a cross-sectional view schematically illustrating a mask according to an embodiment. FIG. 4 is a cross-sectional view of the mask taken along a line II-II' of FIG. 3.

Referring to FIGS. 3 and 4, a mask 400 according to an embodiment may include a mask sheet 410, a conductive layer 420, and a frame 430. For example, the mask 400 may include the mask sheet 410 including a plurality of through holes 411, the conductive layer 420 that is spaced apart from the plurality of through holes 411 on a plane and arranged between the frame 430 and the mask sheet 410, and the frame 430 combined with the conductive layer 420.

The mask 400 according to an embodiment may have the plurality of through holes 411. It will be understood that the mask 400 has the plurality of holes 411 formed in the mask sheet 410 including organic materials. The mask sheet 410 may include organic materials. In an embodiment, the mask sheet 410 may include polyethersulfone, polyacrylate, polyether imide, polyethylene naphthalate, polyethylene terephthalate, polyphenylene sulfide, polyarylate, polyimide, polycarbonate, and/or cellulose acetate propionate. For example, the mask sheet 410 may include a polyimide film.

The mask sheet 410 may have a thickness of 5 to 15 μm in a z-axis direction, and there may be various suitable modifications in which the mask sheet 410 may have a thickness of 5 to 20 μm or 7 to 13 μm.

The conductive layer 420 may be on the mask sheet 410. The conductive layer 420 may be spaced apart from the plurality of through holes 411 defined in the mask sheet 410 on the plane, and may be on the mask sheet 410. In an embodiment, the conductive layer 420 may have a shape in which it surrounds the mask sheet 410 on the plane, and may be on the mask sheet 410.

The conductive layer 420 may include at least one material from among Al, Ti, Mo, Cu, ITO, IZO, and IGZO. The conductive layer 420 may have a first thickness t1 in the z-axis direction from a top surface of the mask sheet 410. In this case, the first thickness t1 of the conductive layer 420 may be in a range of 1000 to 3000 Å, and there may be various suitable modifications in which the first thickness t1 of the conductive layer 420 may be in a range of 1500 to 3000 Å or 1000 to 2500 Å. For example, the first thickness t1 of the conductive layer 420 may be in a range of 1500 to 2500 Å.

The frame 430 may be on the conductive layer 420. The frame 430 may be spaced apart from the plurality of through holes 411 defined in the mask sheet 410 on the plane, and may be on the conductive layer 420. In an embodiment, the frame 430 may surround the mask sheet 410 and the conductive layer 420 on the plane, and may be on the conductive layer 420. The conductive layer 420 may be fixed to the frame 430. For example, the conductive layer 420 may be fixed to the frame 430 by electrostatic force.

Figure 5:
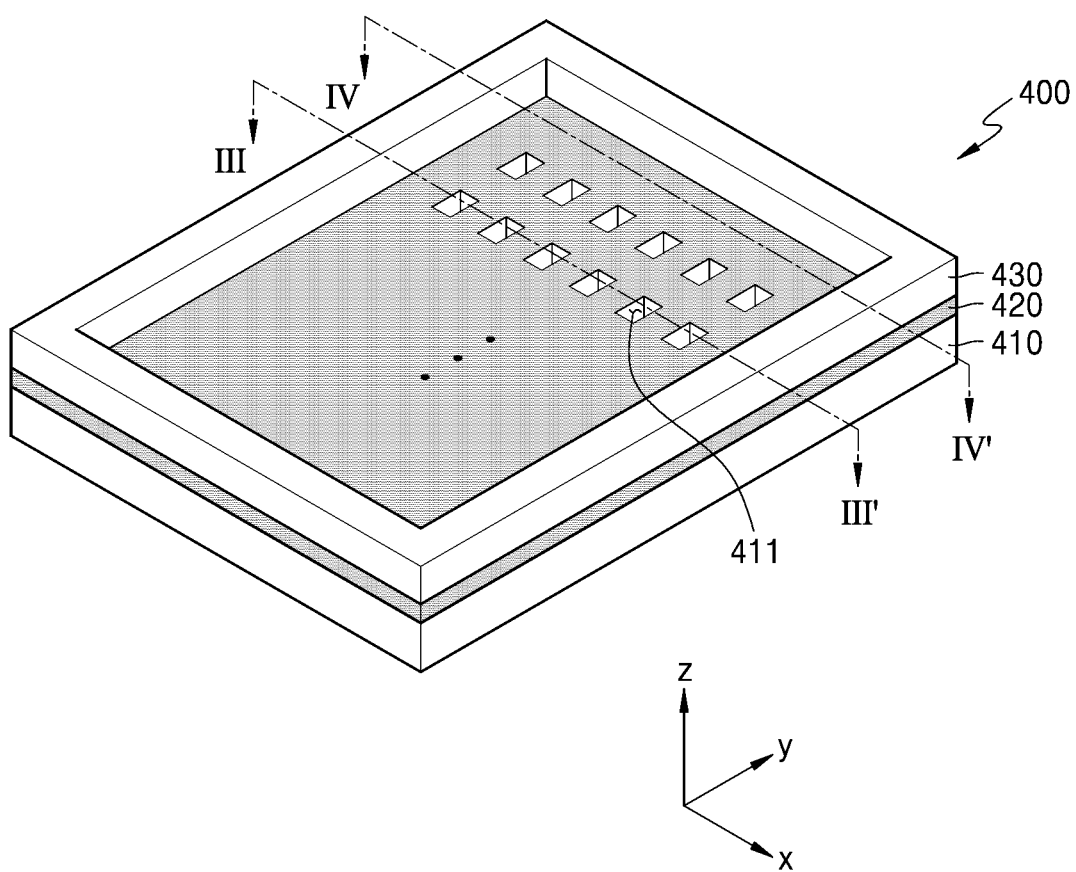
FIG. 5 is a perspective view schematically illustrating a mask according to another embodiment.
Figure 6:
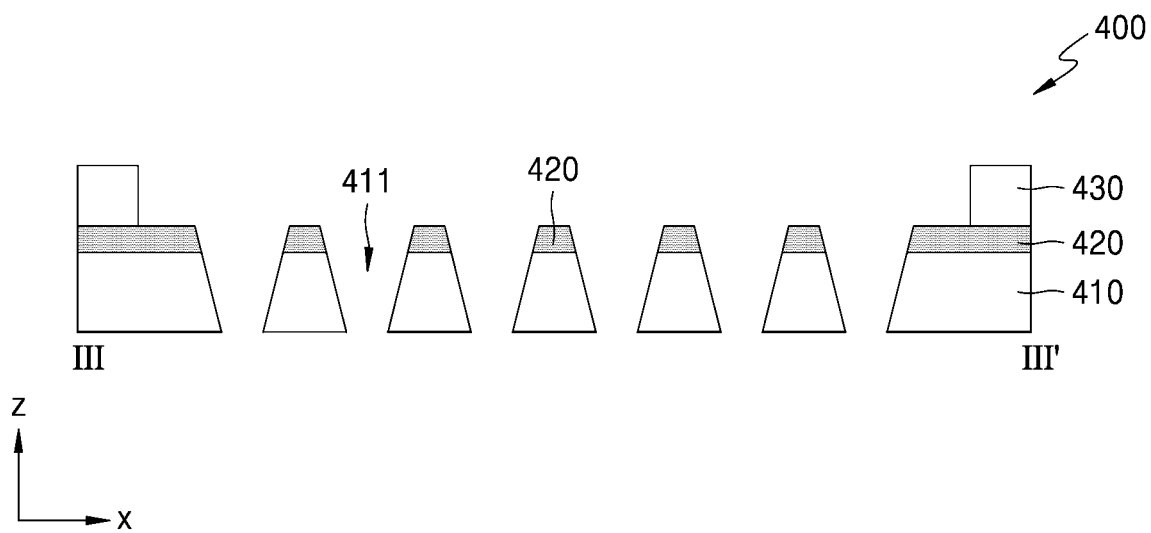
FIG. 6 is a cross-sectional view schematically illustrating a mask according to another embodiment.
Figure 7:
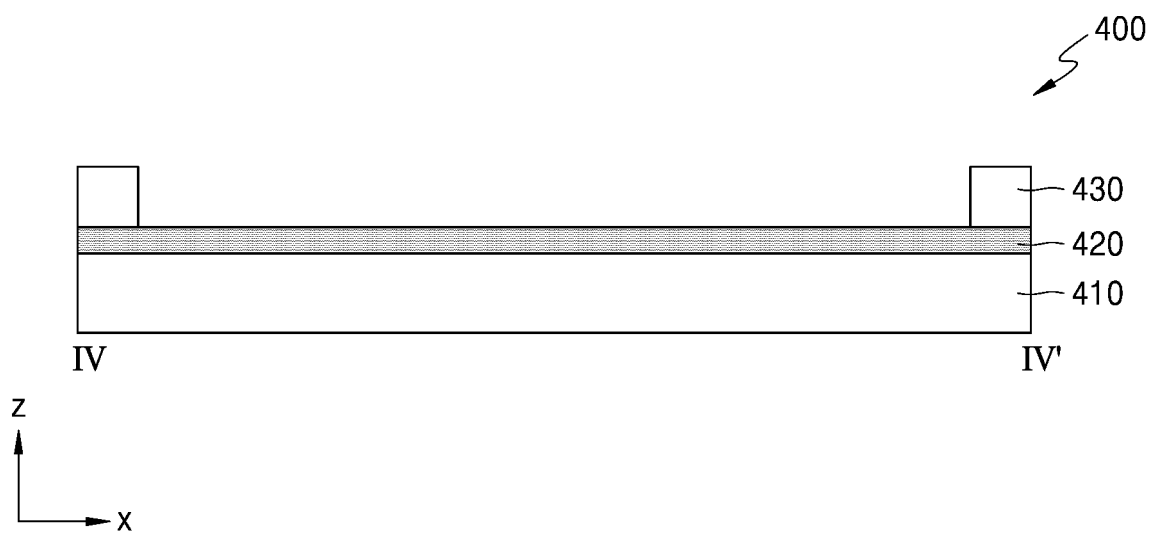
FIG. 7 is a cross-sectional view schematically illustrating a mask according to another embodiment.

FIG. 5 is a perspective view schematically illustrating a mask according to another embodiment, FIG. 6 is a cross-sectional view schematically illustrating the mask according to another embodiment, and FIG. 7 is a cross-sectional view schematically illustrating a mask according to another embodiment. FIG. 6 is a cross-sectional view of the mask taken along a line III-III' of FIG. 5, and FIG. 7 is a cross-sectional view of the mask taken along a line IV-IV' of FIG. 5.

Embodiments of FIGS. 5 through 7 are different from the embodiments of FIGS. 3 and 4 in that the conductive layer 420 has a mesh shape. A duplicative description of the same configuration of FIGS. 5 through 7 as that of FIGS. 3 and 4 will not be repeated here, and hereinafter, differences therebetween will be mainly described.

Referring to FIGS. 5 through 7, the conductive layer 420 may have a mesh shape. The conductive layer 420 may have a mesh shape and may be on the mask sheet 410. The conductive layer 420 may be on the mask sheet 410 but may be spaced apart from the plurality of through holes 411 defined in the mask sheet 410. The conductive layer 420 has a mesh shape so that the conductive layer 420 may not overlap the plurality of through holes 411 defined in the mask sheet 410 and may be on the mask sheet 410.

Figure 8:
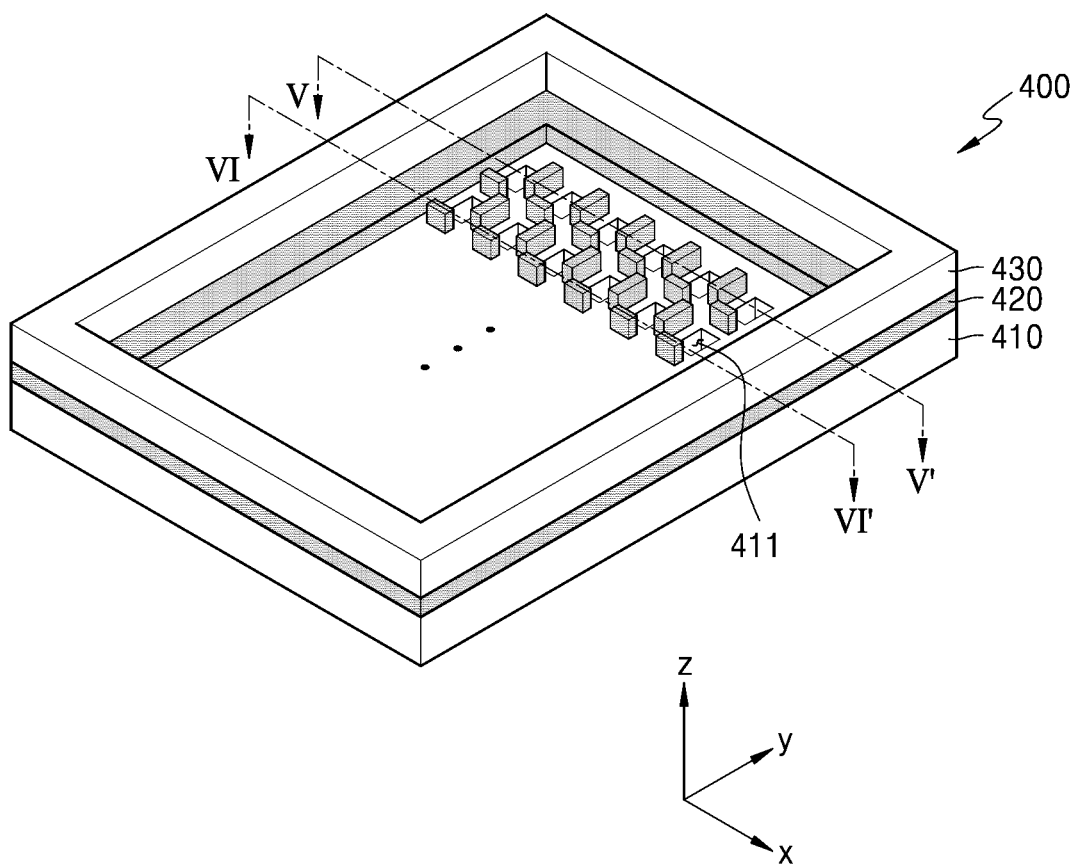
FIG. 8 is a perspective view schematically illustrating a mask according to another embodiment.
Figure 9:
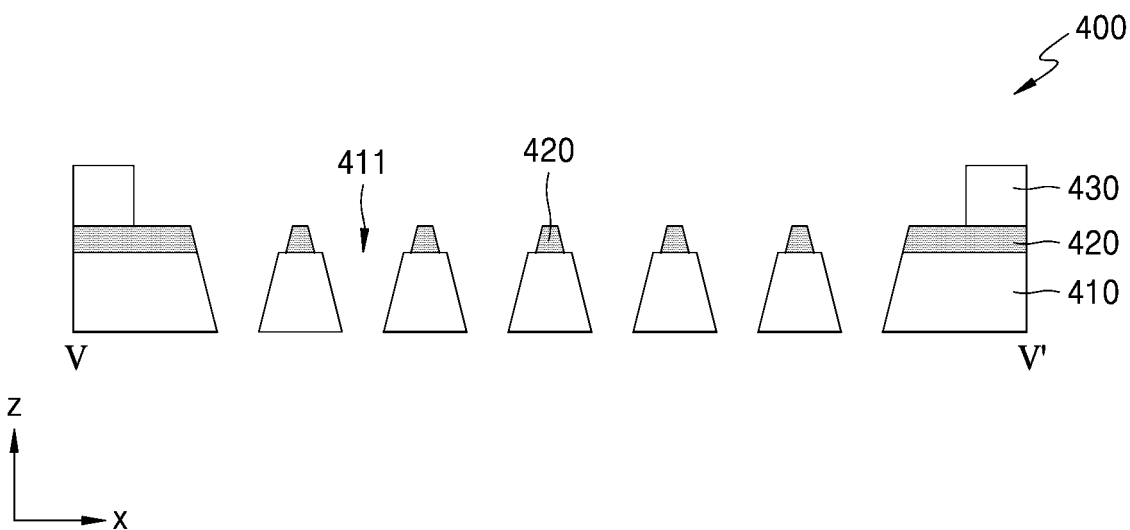
FIG. 9 is a cross-sectional view schematically illustrating a mask according to another embodiment.
Figure 10:
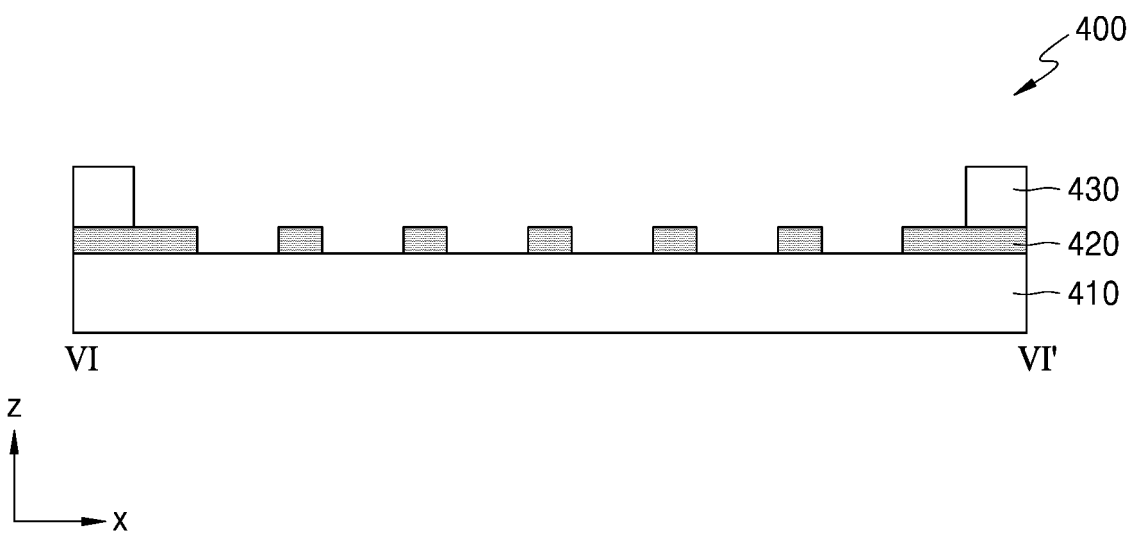
FIG. 10 is a cross-sectional view schematically illustrating a mask according to another embodiment.

FIG. 8 is a perspective view schematically illustrating a mask according to another embodiment, FIG. 9 is a cross-sectional view of the mask taken along a line V-V' of FIG. 8, and FIG. 10 is a cross-sectional view of the mask taken along a line V-V' of FIG. 8.

Embodiments of FIGS. 8 through 10 are different from the embodiments of FIGS. 3 and 4 in that at least part of the conductive layer 420 has an isolated pattern. A duplicative description of the same configuration of FIGS. 8 through 10 as that of FIGS. 3 and 4 will not be repeated here, and hereinafter, differences therebetween will be mainly described.

Referring to FIGS. 8 through 10, at least part of the conductive layer 420 may have an isolated pattern. At least part of the conductive layer 420 may have an isolated pattern, and the conductive layer 420 may be on the mask sheet 410. For example, at least part of the conductive layer 420 on the mask sheet 410 may be patterned to be spaced apart from each other and thus may have an isolated pattern. The conductive layer 420 having the isolated pattern on the plane may have various suitable shapes, such as, for example, a circular shape, an oval shape, and/or a rectangular shape.

The conductive layer 420 may be on the mask sheet 410 but may be spaced apart from the plurality of through holes 411 defined in the mask sheet 410. At least part of the conductive layer 420 may have an isolated pattern so that the conductive layer 420 may not overlap the plurality of through holes 411 defined in the mask sheet 410 and may be on the mask sheet 410. In FIG. 8, the conductive layer 420 having at least part with an isolated pattern is arranged in each of the plurality of through holes 411. However, there may be various suitable modifications in which the conductive layer 420 having at least part with an isolated pattern may be arranged in each of two through holes 411 or in each of four through holes 411.

Figure 11:
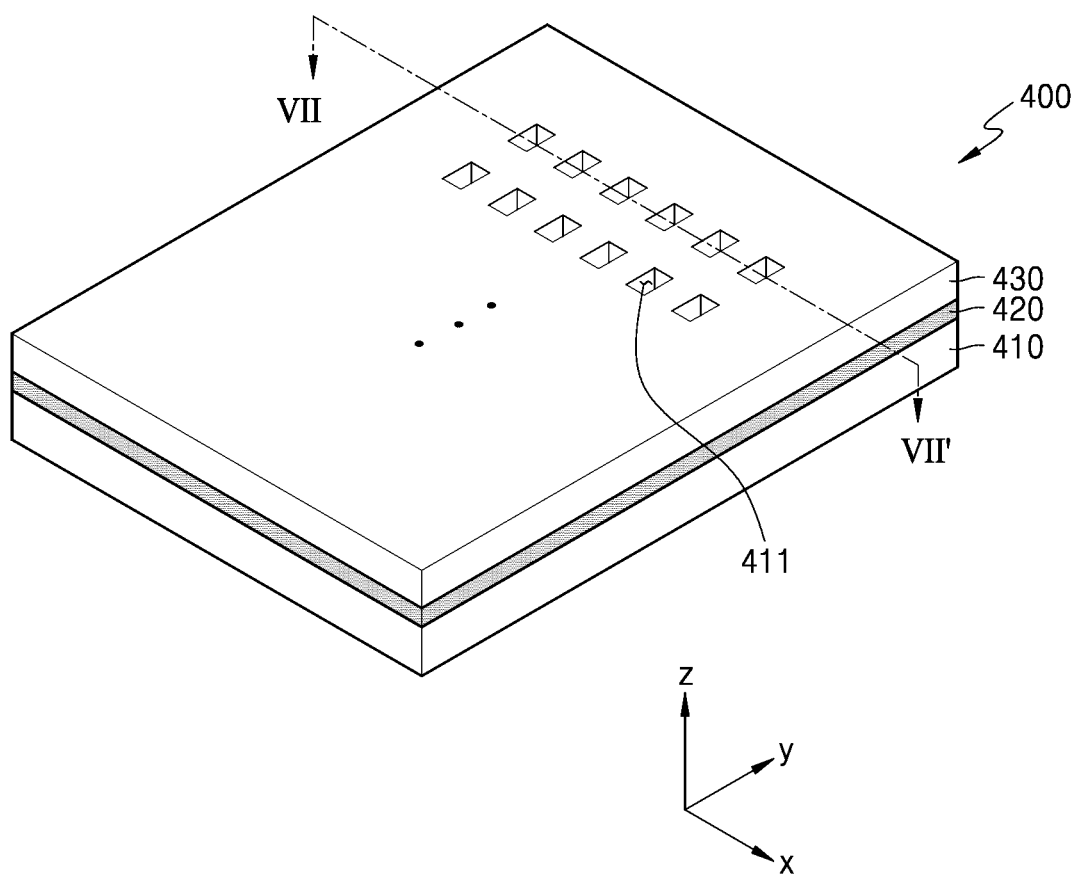
FIG. 11 is a perspective view schematically illustrating a mask according to another embodiment.
Figure 12:
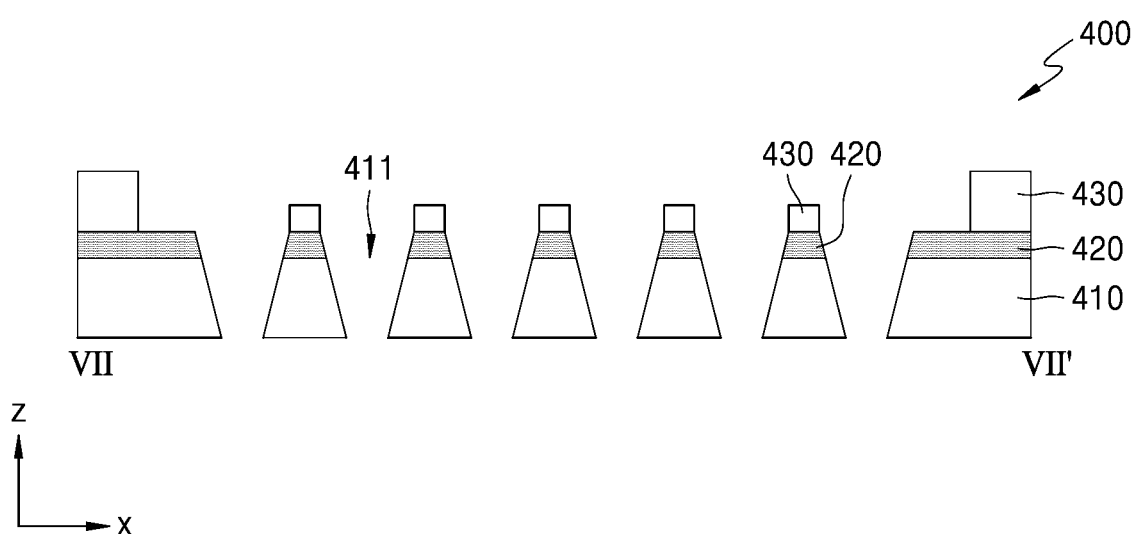
FIG. 12 is a cross-sectional view schematically illustrating a mask according to another embodiment.

FIG. 11 is a perspective view schematically illustrating a mask according to another embodiment. FIG. 12 is a cross-sectional view of the mask taken along a line VII-VII' of FIG. 11.

Embodiments of FIGS. 11 and 12 are different from the embodiments of FIGS. 3 and 4 in that the frame 430 has a mesh shape. A duplicative description of the same configuration of FIGS. 11 and 12 as that of FIGS. 3 and 4 will not be repeated here, and hereinafter, differences therebetween will be mainly described.

Referring to FIGS. 11 and 12, the frame 430 may have a mesh shape. The frame 430 may have a mesh shape and may be on the conductive layer 420. The frame 430 may be on the conductive layer 420 but may be spaced apart from the plurality of through holes 411 defined in the mask sheet 410. The frame 430 may have a mesh shape so that the frame 430 may not overlap the plurality of through holes 411 defined in the mask sheet 410 and may be on the conductive layer 420 and the conductive layer 420 and the frame 430 may be more stably combined together with each other.

In some embodiments, at least part of the frame 430 may have an isolated pattern. At least part of the frame 430 may have an isolated pattern, and the frame 430 may be on the conductive layer 420. For example, at least part of the frame 430 on the conductive layer 420 may be patterned to be spaced apart from each other and thus may have an isolated pattern. The frame 430 having an isolated pattern on the plane may have various suitable shapes including a circular shape, an oval shape, and/or a rectangular shape.

The frame 430 having at least part with an isolated pattern may be arranged in each of the plurality of through holes 411, and there may be various suitable modifications in which the frame 430 may be arranged in each of two through holes 411, or in each of four through holes 411.

FIGS. 13 through 19 are cross-sectional views schematically illustrating a method of manufacturing a mask, according to an embodiment.

Hereinafter, the method of manufacturing a mask will be sequentially described with reference to FIGS. 13 through 19.

The method of manufacturing a mask according to an embodiment may include forming an organic material layer 410M on a mask substrate 401 and patterning a hard mask 415 on the organic material layer 410M, forming a mask sheet 410 including through holes 411, by etching the organic material layer 410M, removing the hard mask 415 on the mask sheet 410, forming a conductive material layer 420M on the mask sheet 410, and forming a conductive layer 420 by etching the conductive material layer 420M.

In addition, the method may further include, after the forming of the conductive layer 420 by etching the conductive material layer 420M is performed, fixing the frame 430 to the conductive layer 420 and detaching the mask substrate 401.

Figure 13:
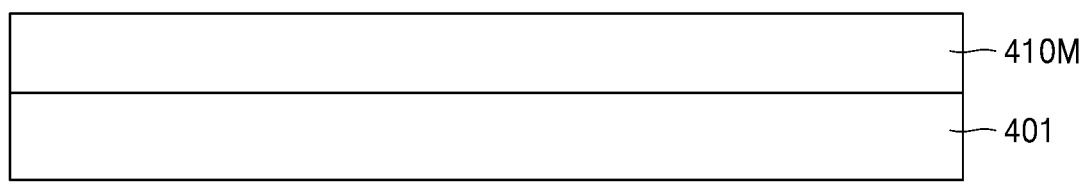
FIGS. 13 through 19 are cross-sectional views schematically illustrating a method of manufacturing a mask, according to an embodiment.

Referring to FIG. 13, firstly, the organic material layer 410M may be formed on the mask substrate 401. The organic material layer 410M may include organic materials. In an embodiment, the organic material layer 410M may include polyethersulfone, polyacrylate, polyether imide, polyethylene naphthalate, polyethylene terephthalate, poly- phenylene sulfide, polyarylate, polyimide, polycarbonate, and/or cellulose acetate propionate. For example, the organic material layer 410M may include polyimide.

Figure 14:
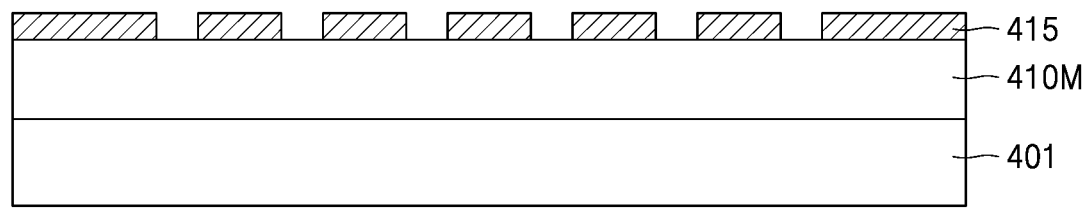

Referring to FIG. 14, after the forming of the organic material layer 410M on the mask substrate 401 is performed, patterning the hard mask 415 on the organic material layer 410M may be further performed.

In the patterning of the hard mask 415 on the organic material layer 410M, IZO may be formed on the organic material layer 410M by using a sputter (e.g., by sputtering or any other suitable vacuum deposition process), and IZO may be patterned into the hard mask 415 by using a photoresist. For example, after IZO is formed on the organic material layer 410M by using a sputter and the photoresist is entirely applied to IZO, only part of the photoresist may be exposed and developed to form a pattern layer, and IZO may be etched to be patterned into the hard mask 415. In this case, IZO may be patterned into the hard mask 415 through a wet etching process. When the wet etching process is performed, a portion of the IZO in which no pattern layer is formed, may be etched, and a portion of the IZO in which a pattern layer is formed, may remain so that the hard mask 415 may be formed.

Figure 15:
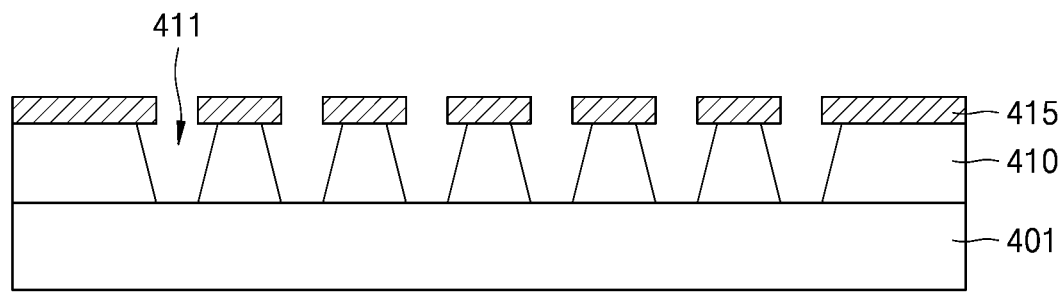

Referring to FIG. 15, after the patterning of the hard mask 415 on the organic material layer 410M is performed, forming the mask sheet 410 including the through holes 411, by etching the organic material layer 410M may be further performed.

In the forming of the mask sheet 410 including the through holes 411, by etching the organic material layer 410M, the organic material layer 410M may be etched through a dry etching process. In this case, a portion of the organic material layer 410M on a lower portion of the patterned hard mask 415 may not be etched, and a portion of the organic material layer 410M in which the hard mask 415 is not patterned, may be etched, and the mask sheet 410 may be formed. The hard mask 415 may remain on the patterned mask sheet 410.

The mask sheet 410 may be patterned by dry etching the organic material layer 410M. An unetched portion of the organic material layer 410M may be the mask sheet 410, and an etched portion of the organic material layer 410M by dry etching may be defined as the through holes 411.

Figure 16:
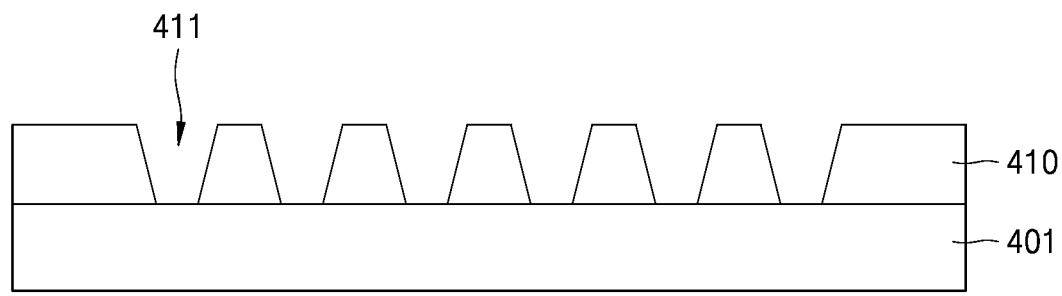

Referring to FIG. 16, after the forming of the mask sheet 410 including the through holes 411, by etching the organic material layer 410M, removing of the hard mask 415 on the mask sheet 410 may be further performed.

In the removing of the hard mask 415 on the mask sheet 410, the hard mask 415 that remains on the patterned mask sheet 410 may be removed. For example, the patterned mask sheet 410 may not be removed, and a wet etching process may be used to remove the hard mask 415 that remains on the patterned mask sheet 410.

Figure 17:
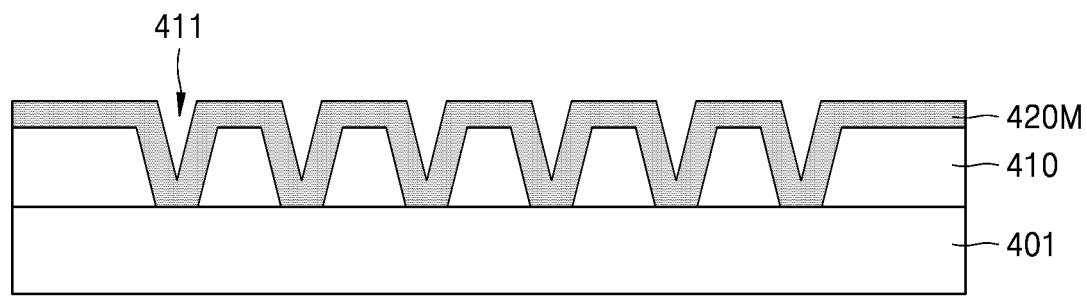

Referring to FIG. 17, after the removing of the hard mask 415 on the mask sheet 410 is performed, forming the conductive material layer 420M on the mask sheet 410 may be further performed.

In the forming of the conductive material layer 420M on the mask sheet 410, the conductive material layer 420M may include at least one of Al, Ti, Mo, Cu, ITO, IZO, and IGZO. In an embodiment, the conductive material layer 420M may be formed even in the through holes 411 defined in the mask sheet 410.

Figure 18:
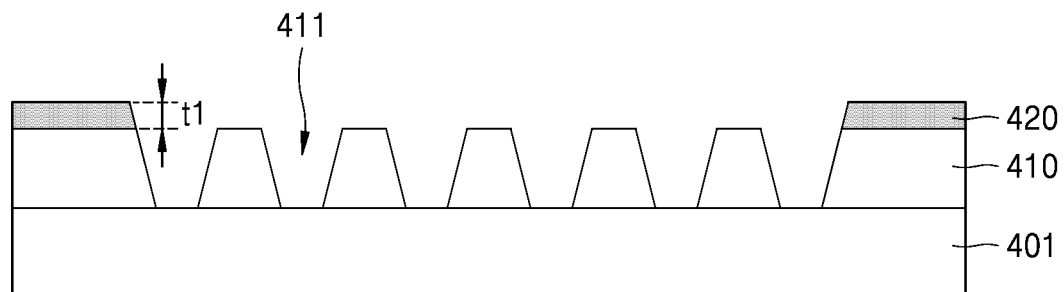

Referring to FIG. 18, after the forming of the conductive material layer 420M on the mask sheet 410 is performed, forming the conductive layer 420 by etching the conductive material layer 420M may be further performed.

In the forming of the conductive layer 420 by etching the conductive material layer 420M, after the photoresist is entirely applied to the conductive material layer 420M, only a part of the photoresist may be exposed and developed to form a pattern layer, and the conductive layer 420 may be formed by etching the conductive material layer 420M. In this case, the conductive layer 420 may be formed by dry etching the conductive material layer 420M. When a dry etching process is performed, a portion of the conductive material layer 420M in which no pattern layer is formed, may be etched, and a portion of the conductive material layer 420M in which a pattern layer is formed, may remain so that the conductive material 420 may be formed.

The conductive layer 420 may have a first thickness t1 in the z-axis direction from a top surface of the mask sheet 410. In this case, the first thickness t1 of the conductive layer 420 may be in a range of 1000 to 3000 Å, and there may be various suitable modifications in which the first thickness t1 of the conductive layer 420 may be in a range of 1500 to 3000 Å or 1000 to 2500 Å. For example, the first thickness t1 of the conductive layer 420 may be in a range 1500 to 2500 Å.

The conductive layer 420 may be formed to be spaced apart from the through holes 411 defined in the mask sheet 410. In an embodiment, the conductive layer 420 may surround the mask sheet 410 on the plane. In some embodiments, the conductive layer 420 may be spaced apart from the through holes 411 defined in the mask sheet 410 and may have various suitable shapes including a mesh shape and/or an isolated pattern.

Figure 19:
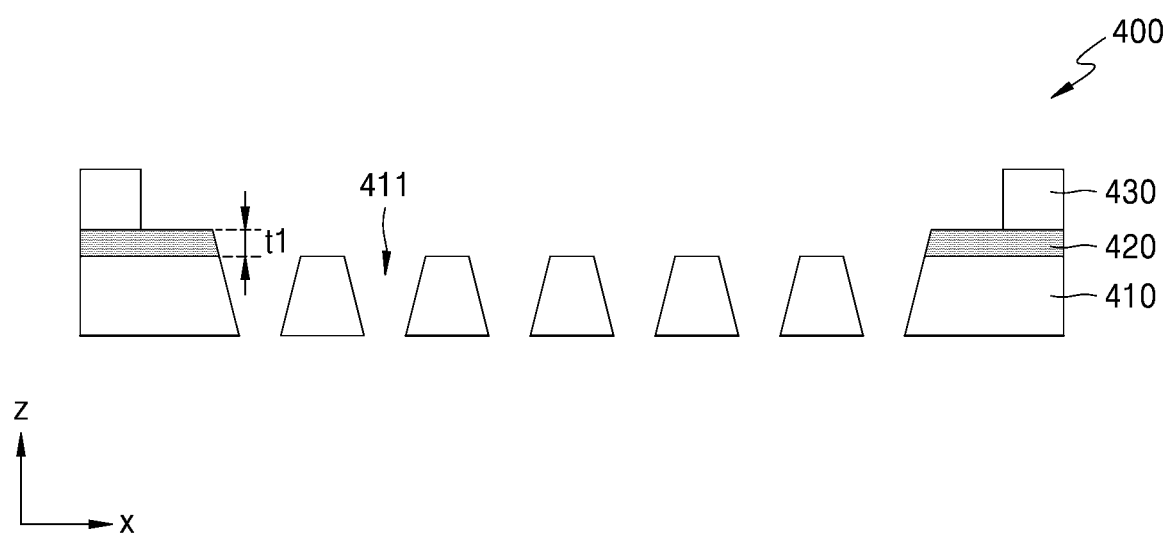

Referring to FIG. 19, after the forming of the conductive layer 420 by etching the conductive material layer 420M is performed, fixing the frame 430 to the conductive layer 420 and detaching the mask substrate 401 may be further performed.

In the fixing of the frame 430 to the conductive layer 420, the conductive layer 420 may be fixed to the frame 430 by electrostatic force. In an embodiment, the frame 430 may surround the conductive layer 420 on the plane. In some embodiments, the frame 430 may be spaced apart from the through holes 411 defined in the mask sheet 410 and may have various suitable shapes including a mesh shape and/or an isolated pattern.

Subsequently, after the fixing of the frame 430 to the conductive layer 420 is performed, the mask substrate 401 may be detached from the mask sheet 410. In an embodiment, after the mask substrate 401 is detached from the mask sheet 410, the frame 430 may be fixed to the conductive layer 420.

In a fine metal mask (FMM), when a large area mask is used, deformation and/or sagging of the mask may occur due to a load. Pattern distortion may occur due to the deformation and/or sagging of the mask.

In some embodiments, in the case of a mask sheet including organic materials and a mask including a hard mask including IZO, when a dry etching process of the organic materials by using the hard mask is performed, undercut may occur due to isotropic etching so that deposition uniformity may be lowered due to a tip (e.g., protrusion) of the hard mask.

In a method of manufacturing a mask according to an embodiment and a mask manufactured by the same, a hard mask on a mask sheet including organic materials may be removed, and a conductive layer may be patterned so that, when an intermediate layer or a light-emitting layer of a display apparatus is formed on a substrate, the intermediate layer or the light-emitting layer may be precisely formed with a preset pattern so that deposition uniformity may be enhanced (e.g., improved). In addition, a conductive layer may be freely patterned on the mask sheet including the organic materials so that a frame may be provided in various suitable shapes.

As described above, in one or more embodiments, a method of manufacturing a mask, whereby deposition uniformity may be enhanced (e.g., improved) during the manufacture of a large display apparatus, a mask manufactured by the same, and a method of manufacturing a display apparatus by using the same may be implemented. The scope of the present disclosure, however, is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A method of manufacturing a mask, comprising:
forming an organic material layer on a mask substrate and patterning a hard mask on the organic material layer;
etching the organic material layer to form a mask sheet including through holes;
removing the hard mask on the mask sheet;
forming an electrically conductive material layer on the mask sheet;
etching the electrically conductive material layer to form an electrically conductive layer,
fixing a frame to the electrically conductive layer; and
detaching the mask substrate,
wherein the electrically conductive material layer comprises at least one selected from titanium (Ti), molybdenum (Mo), copper (Cu), indium tin oxide (ITO), indium zinc oxide (IZO), and indium-gallium-zinc oxide (IGZO).

2. The method of claim 1, wherein, in the etching the organic material layer to form the mask sheet including through holes, the etching comprises a dry etching process.

3. The method of claim 1, wherein, in the etching the electrically conductive material layer to form the electrically conductive layer, the etching includes a dry etching process.

4. The method of claim 1, wherein the electrically conductive layer has a first thickness from a top surface of the mask sheet, and the first thickness is in a range of 1500 to 2500 Å.

5. The method of claim 1, wherein the electrically conductive layer is spaced apart from the through holes of the mask sheet and has a mesh shape.

6. The method of claim 1, wherein at least part of the electrically conductive layer is spaced apart from the through holes of the mask sheet and has an isolated pattern.

7. The method of claim 1, wherein the electrically conductive layer is fixed to the frame by electrostatic force.

8. The method of claim 1, wherein the frame is spaced apart from the through holes of the mask sheet and has a mesh shape.

9. The method of claim 1, wherein at least part of the frame is spaced apart from the through holes of the mask sheet and has an isolated pattern.

\* \* \* \* \*